(12) United States Patent
Baek et al.

(10) Patent No.: US 8,314,003 B2
(45) Date of Patent: Nov. 20, 2012

(54) NONVOLATILE MEMORY DEVICES THAT USE RESISTANCE MATERIALS AND INTERNAL ELECTRODES, AND RELATED METHODS AND PROCESSING SYSTEMS

(75) Inventors: In-Gyu Baek, Seoul (KR); Hyun-Jun Sim, Gyeonggi-do (KR); Jin-Shi Zhao, Gyeonggi-do (KR); Eun-Kyung Yim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/101,263

(22) Filed: May 5, 2011

(65) Prior Publication Data
US 2011/0204315 A1   Aug. 25, 2011

Related U.S. Application Data

(62) Division of application No. 12/353,553, filed on Jan. 14, 2009, now Pat. No. 7,952,163.

(30) Foreign Application Priority Data

Mar. 13, 2008 (KR) .............................. 2008-0023416

(51) Int. Cl.
*H01L 21/20* (2006.01)
(52) U.S. Cl. ......... 438/382; 257/E21.004; 257/E29.001; 257/E45.001

(58) Field of Classification Search .................. 438/382; 257/E21.004, E29.001, E45.001
See application file for complete search history.

(56) References Cited

U.S. PATENT DOCUMENTS

| 2007/0159868 A1 | 7/2007 | Sugita et al. |
| 2009/0141547 A1 | 6/2009 | Jin et al. |
| 2010/0328988 A1 | 12/2010 | Nagashima et al. |

FOREIGN PATENT DOCUMENTS

| JP | 2004-158804 | 6/2004 |
| KR | 1020050071954 A | 7/2005 |
| KR | 1020060001051 A | 1/2006 |

*Primary Examiner* — David S Blum
(74) *Attorney, Agent, or Firm* — Myers Bigel Sibley & Sajovec

(57) ABSTRACT

A nonvolatile memory device, a method of fabricating the nonvolatile memory device and a processing system including the nonvolatile memory device. The nonvolatile memory device may include a plurality of internal electrodes that extend in a direction substantially perpendicular to a face of a substrate, a plurality of first external electrodes that extend substantially in parallel with the face of the substrate, and a plurality of second external electrodes that also extend substantially in parallel with the face of the substrate. Each first external electrode is on a first side of a respective one of the internal electrodes, and each second external electrode is on a second side of a respective one of the internal electrodes. These devices also include a plurality of variable resistors that contact the internal electrodes, the first external electrodes and the second external electrodes.

5 Claims, 19 Drawing Sheets

NONVOLATILE MEMORY DEVICES THAT USE RESISTANCE MATERIALS AND INTERNAL ELECTRODES, AND RELATED METHODS AND PROCESSING SYSTEMS

CROSS-REFERENCE TO RELATED APPLICATIONS

This U.S. non-provisional patent application claims priority under 35 U.S.C. §120 as a divisional of U.S. patent application Ser. No. 12/353,553, now U.S. Pat. No. 7,952,163, filed Jan. 14, 2009, which in turn claims priority under 35 U.S.C. §119 to Korean Patent Application No. 10-2008-0023416, filed on Mar. 13, 2008 in the Korean Intellectual Property Office. The disclosure of each of the above applications is incorporated herein by reference in its entirety.

FIELD OF THE INVENTION

The present invention relates to semiconductor devices and, more particularly, to nonvolatile memory devices, methods of fabricating nonvolatile memory devices, and to processing systems that include nonvolatile memory devices.

BACKGROUND

Nonvolatile memory devices that use resistance materials include resistive random access memory (RRAM) devices, magnetic random access memory (MRAM) devices, and phase-change random access memory (PRAM) devices. Nonvolatile memory devices using resistance materials store data using changes in the resistance of a variable-resistance material (in the case of RRAM devices), changes in the resistance of a magnetic tunnel junction (MTJ) film in accordance with the magnetization state of a ferromagnetic material (in the case of MRAM devices), or changes in the state of a phase-change material such as a chalcogenide alloy (in the case of PRAM devices). In contrast, dynamic random access memory (DRAM) devices or flash memory devices store data using electric charges.

A resistive memory cell may include a variable-resistance element disposed between an upper electrode and a lower electrode, and the resistance of the variable-resistance element may vary according to the voltages applied to the respective upper and lower electrodes.

SUMMARY

Pursuant to embodiments of the present invention, nonvolatile memory devices are provided that may have a reduced memory cell area and an increased memory density. Methods of fabricating such nonvolatile memory devices and processing systems that include such nonvolatile memory devices are also provided.

Pursuant to certain embodiments of the present invention, nonvolatile memory devices are provided that include a plurality of internal electrodes that extend in a direction substantially perpendicular to a face of a substrate such as, for example, a top surface of the substrate. These devices further include a plurality of first external electrodes that extend substantially in parallel with the face of the substrate, where each first external electrode is on a first side of a respective one of the internal electrodes, and a plurality of second external electrodes that also extend substantially in parallel with the face of the substrate, where each second external electrode is on a second side of a respective one of the internal electrodes. These devices also include a plurality of variable resistors that contact the internal electrodes, the first external electrodes and the second external electrodes.

Pursuant to further embodiments of the present invention, nonvolatile memory devices that include a plurality of internal electrodes that extend in a direction substantially perpendicular to a face of a substrate are provided. These nonvolatile memory device further include a plurality of third external electrodes and a plurality of fourth external electrodes, both of which extend substantially in parallel with the face of the substrate and which are disposed on at least one side of the internal electrodes. The third external electrodes and the fourth external electrodes overlap each other in the direction in which the internal electrodes extend. The device also include a plurality of variable resistors that contact the internal electrodes, the third external electrodes and the fourth external electrodes.

Pursuant to still further embodiments of the present invention, methods of fabricating a nonvolatile memory device are provided. Pursuant to these method, a plurality of first external electrodes and a plurality of second external electrodes are formed on a substrate to extend substantially in parallel with a face of the substrate such as, for example, a top surface of the substrate. An insulating layer that covers the first external electrodes and the second external electrodes is then formed. A plurality of contact holes are formed through the insulating layer between the first external electrodes and the second external electrodes, the contact holes being substantially perpendicular to the face of the substrate. A plurality of variable resistors are formed that directly contact the first external electrodes and the second external electrodes. Finally, a plurality of internal electrodes are formed by depositing a conductive material in the contact holes. The internal electrodes contact the variable resistors and extend in a direction substantially perpendicular to the face of the substrate.

According to still further embodiments of the present invention, processing systems that include nonvolatile memory devices are provided. The nonvolatile memory device included in the processing system may include a plurality of internal electrodes that extend in a direction substantially perpendicular to a first side of a substrate, a plurality of first external electrodes and a plurality of second external electrodes which both extend substantially in parallel with the first side of the substrate and which are formed on both sides of the internal electrodes. These nonvolatile memory devices further include a plurality of variable resistors that contact the internal electrodes, the first external electrodes and the second external electrodes. The processing system further includes a processor which drives the nonvolatile memory device.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Figure 1:
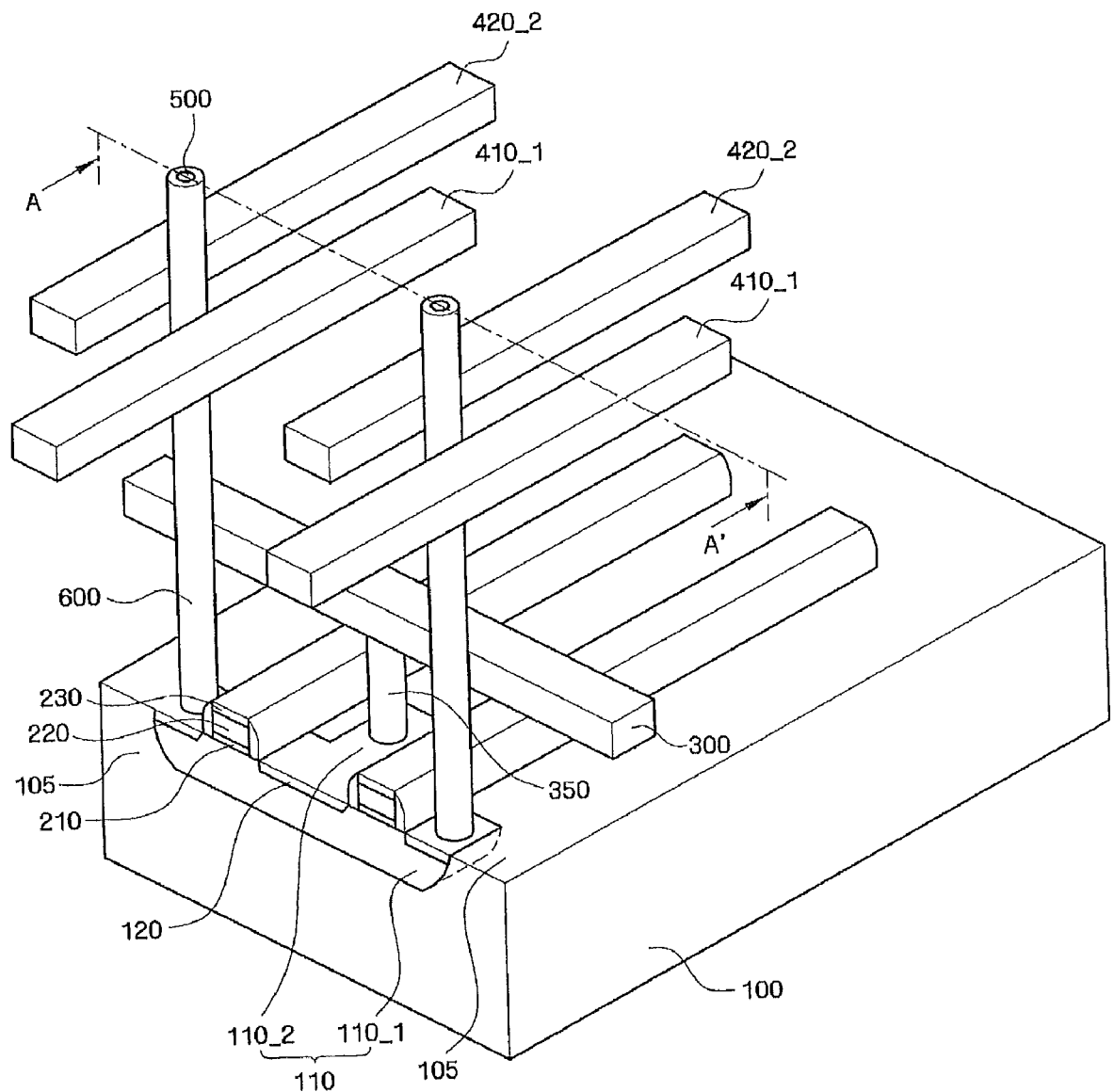
FIG. 1 is a schematic perspective view of part of a nonvolatile memory device according to a first exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, or "contacting" another element, the element can be directly connected to, coupled to or contacting the other element, or intervening elements may be present. In contrast, when an element is referred to as being "directly connected to" or "directly coupled to" or "directly contacting" another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention will hereinafter be described in detail, taking a resistive random access memory (RRAM) device as an example. However, the present invention is not restricted to RRAM devices. That is, the present invention can also be applied to other nonvolatile memory devices using resistance materials including, for example, a magnetic random access memory (MRAM) device that includes a magnetic tunnel junction and a phase-change random access memory (PRAM) device that includes a chalcogenide alloy.

A nonvolatile memory device according to an exemplary embodiment of the present invention will hereinafter be described in detail with reference to FIGS. 1-5.

Figure 2:
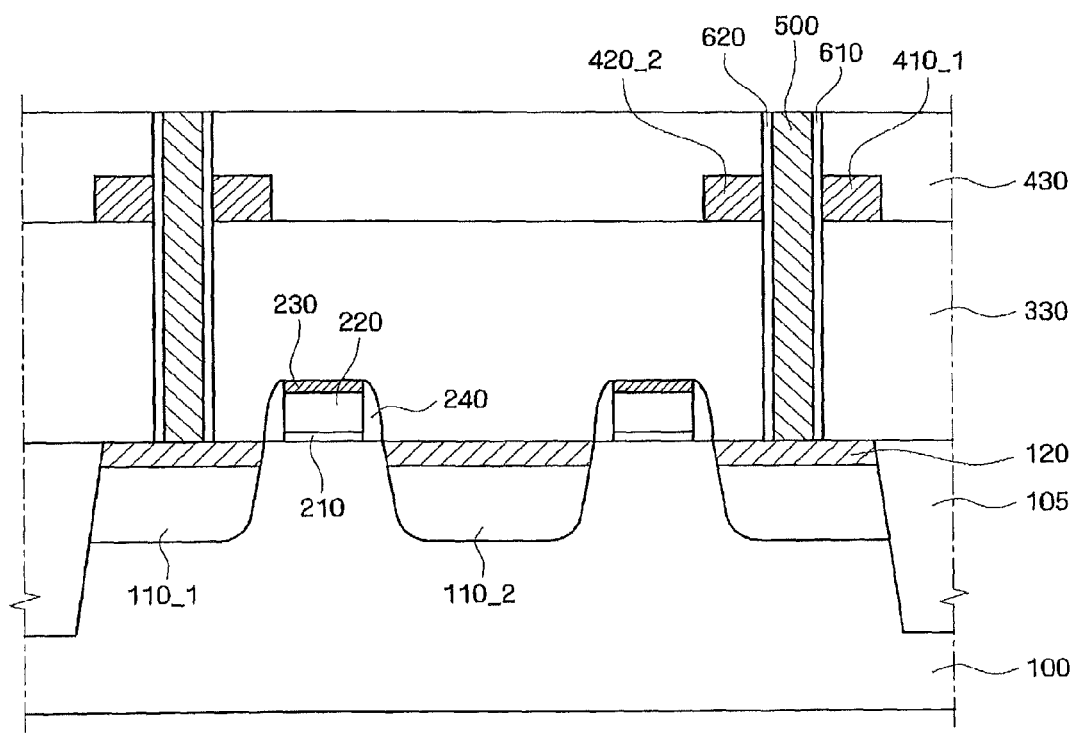
FIG. 2 is a cross-sectional view, taken along line A-A' of FIG. 1, of the nonvolatile memory device according to the first exemplary embodiment.

FIG. 1 is a schematic perspective view of part of a nonvolatile memory device according to a first exemplary embodiment of the present invention. FIG. 2 is a cross-sectional view of the nonvolatile memory device according to the first exemplary embodiment, taken along line A-A' of FIG. 1.

Referring to FIGS. 1 and 2, a plurality of isolation regions 105 may be formed in a face of a substrate 100. In this particular embodiment, the face is the top surface of the substrate. The substrate 100 may be a silicon substrate, a silicon-on-insulator (SOI) substrate, a gallium-asbestos substrate, a silicon-germanium substrate, a ceramic substrate, a quartz substrate, a glass substrate or any other microelectronic device substrate. The isolation regions 105 may comprise, for example, field oxide (FOX) regions obtained by local oxidation-of-silicon (LOCOS) or may be shallow trench isolation (STI) regions.

A plurality of wordlines (210, 220 and 230) may be arranged on the top surface of the substrate 100. Each of the wordlines may include a gate insulating layer pattern 210, a gate electrode 220 and a gate silicide layer pattern 230. The wordlines (210, 220 and 230) may extend in a first direction, which is substantially parallel to the top surface of the substrate 100. The wordlines (210, 220 and 230) may serve as selectors by overlapping a plurality of active regions 110.

The gate insulating layer patterns 210 may be provided between the substrate 100 and the gate electrodes 220. The gate insulating layer patterns 210 may be formed, for example, of silicon oxide, SiON, GexOyNz, GexSiyOz, a high-k dielectric material or a combination thereof or may include a stack of silicon oxide, SiON, GexOyNz, GexSiyOz, and the high-k dielectric material. Examples of the high-k dielectric material include $HfO_2$, $ZrO_2$, $Al_2O_3$, $Ta_2O_5$, hafnium silicate, zirconium silicate and a combination thereof, but the present invention is not restricted to those set forth herein.

The gate electrodes 220 may be formed, for example, by depositing polysilicon or a metal such as tungsten (W), tantalum (Ta), titanium (Ti), molybdenum (Mo), hafnium (Hf), zirconium (Zr), cobalt (Co), chromium (Cr), nickel (Ni), platinum (Pt), and/or ruthenium (Ru) and patterning the deposited material(s).

Source/drain regions may be formed on both sides of each of the gate electrodes 220 by implanting impurities into the active regions 110. The shape of the active regions 110 will be described later in detail.

Gate silicide layer patterns 230 may be formed on the gate electrodes 220, and a plurality of silicide layer patterns 120 may be formed in the source/drain regions. The gate silicide layer patterns 230 and the silicide layer patterns 120 may comprise at least one of the following refractory metals having a low electric resistance and excellent thermal stability: titanium, molybdenum, tungsten, cobalt, nickel, tantalum, platinum, and palladium (Pd). The gate silicide layer patterns 230 and the silicide layer patterns 120 may reduce contact resistance.

Spacers 240 may be provided on both sidewalls of each of the gate electrodes 220. The spacers 240 may be formed of a material having an etching selectivity with respect to a first interlayer dielectric layer 330 such as, for example, SiN, SiON, or $SiO_2$.

A plurality of bitlines 300 may be formed above the wordlines (210, 220 and 230). The bitlines 300 may extend in a third direction, which is different from the first direction, and may thus intersect the wordlines (210, 220 and 230) when viewed from above. The third direction may be substantially perpendicular to the first direction. Each bitline 300 may be connected to one of the active regions 110 through a respective bitline contact 350. Two wordlines (210, 220 and 230) may be formed on each of the active regions 110, and may share one bitline 300.

The first interlayer dielectric layer 330 may be formed to a height above the top of the bitline 300 to insulate the wordlines (210, 220 and 230) and the bitlines 300. The first interlayer dielectric layer 330 may be divided into a lower portion which covers the wordlines (210, 220 and 230) and an upper portion which is disposed on the lower portion to cover the bitlines 300.

A plurality of first external electrodes 410_1 and a plurality of second external electrodes 420_2 may be formed on the first interlayer dielectric layer 330, and may extend in the first direction. The first external electrodes 410_1 and the second external electrodes 420_2 may be formed in a bar shape and may be spaced apart from each other. The first external electrodes 410_1 and the second external electrodes 420_2 may be arranged in pairs. One or more internal electrodes 500 may be formed in the spaces between each pair of a first external electrode 410_1 and a second external electrode 420_2. Each of the internal electrodes 500 may be shared by one or more of the first external electrodes 410_1 and by one or more of the second external electrodes 420_2. In particular, as shown in FIG. 1, a first external electrode 410_1 may be disposed on one side of an internal electrode 500 and a second external electrode 420_2 may be disposed on the other side of the internal electrode 500. Each of the first external electrode 410_1 and the second external electrode 420_2 may intersect and share the internal electrode 500.

The first external electrodes 410_1 and the second external electrodes 420_2 may be formed of, for example, one or more of tungsten (W), titanium nitride (TiN), aluminum (Al), copper (Cu), iridium (Ir), platinum, ruthenium (Ru), polysilicon and/or other noble metals. In certain embodiments, the first external electrodes 410_1 and the second external electrode 420_2 may comprise tungsten, titanium nitride and/or aluminum. The first external electrodes 410_1 and the second external electrodes 420_2 may serve as the source lines for a plurality of variable resistors 600, which are described below.

Figure 3:
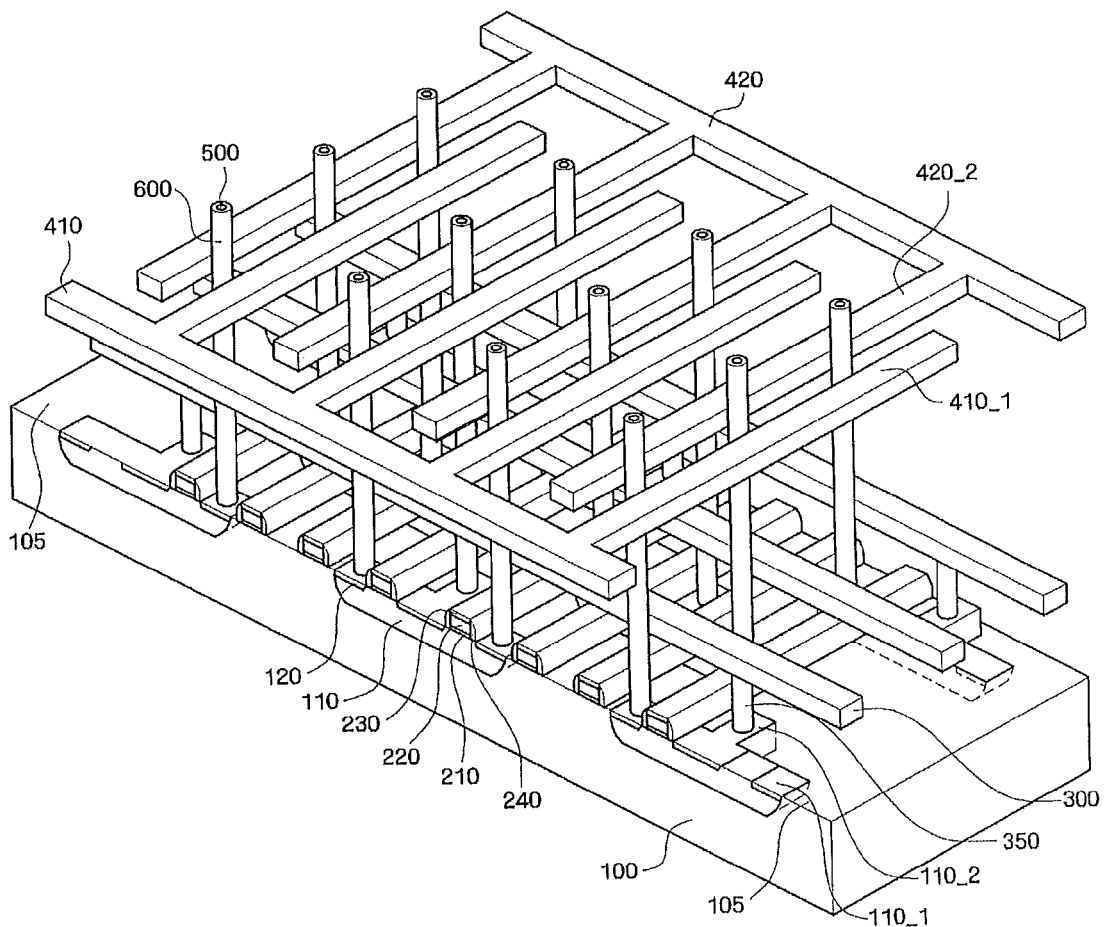
FIG. 3 is a perspective view of the nonvolatile memory device according to the first exemplary embodiment.
Figure 4:
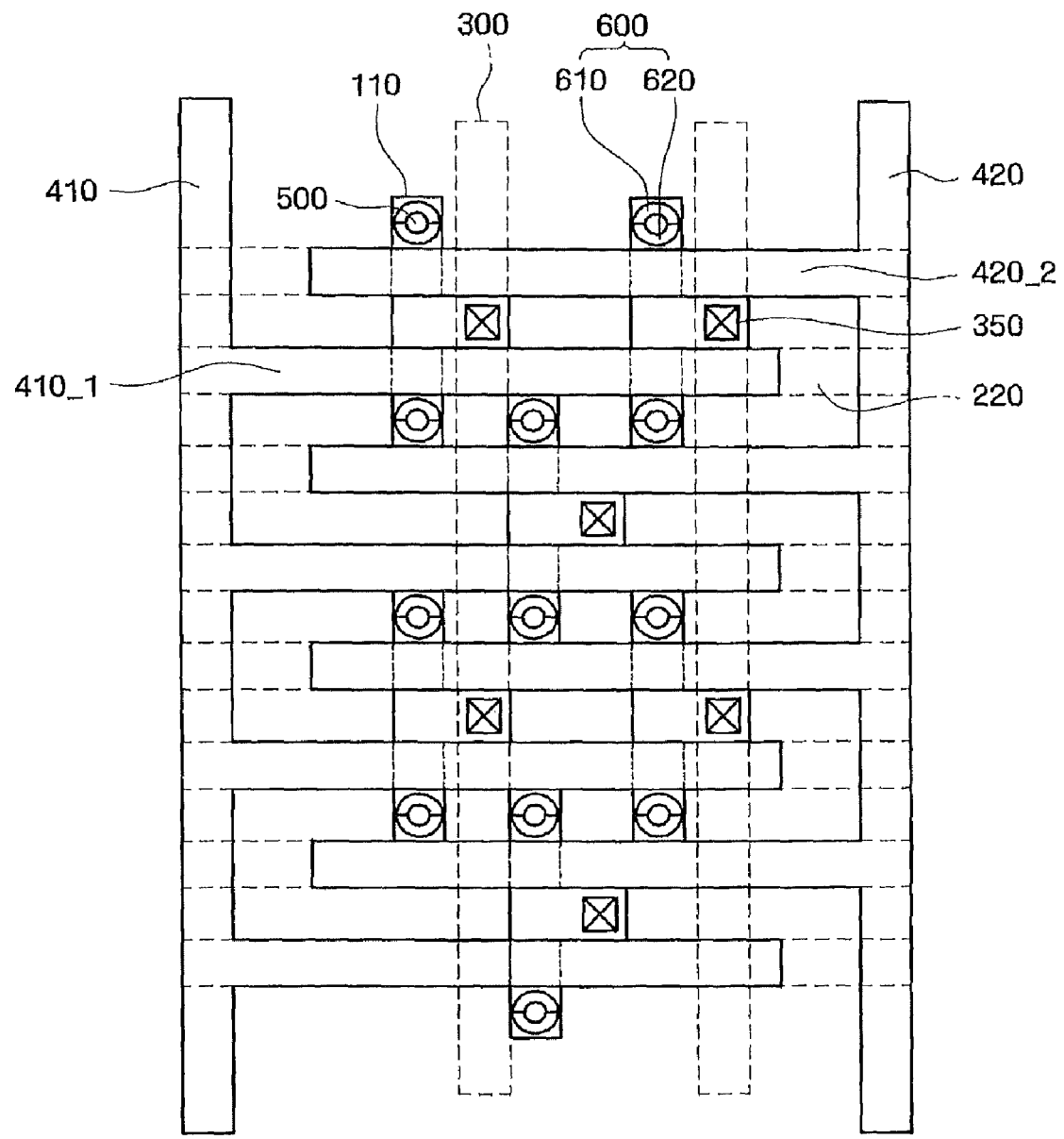
FIG. 4 is a plan view of the nonvolatile memory device according to the first exemplary embodiment.
Figure 5:
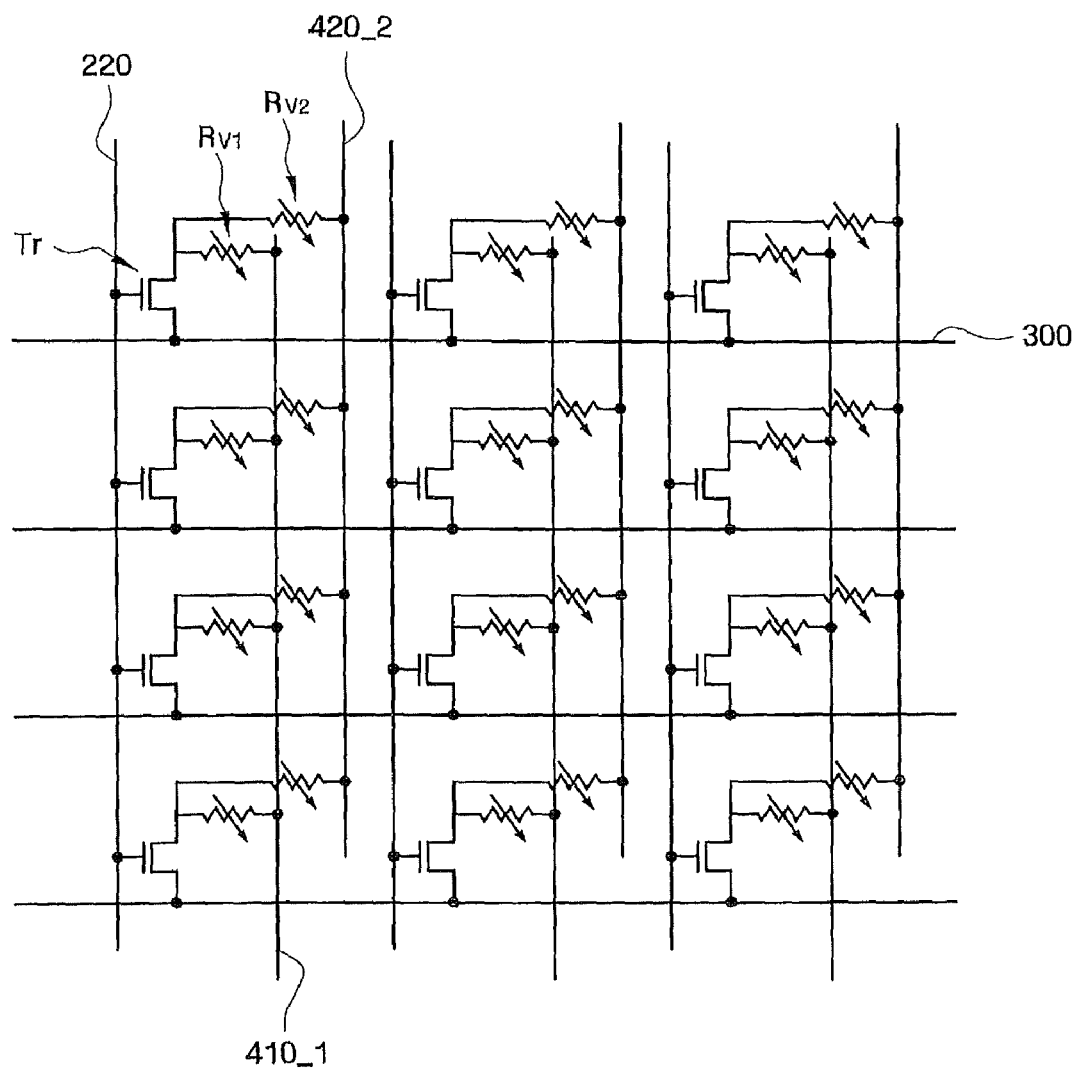
FIG. 5 is a circuit diagram of the nonvolatile memory device according to the first exemplary embodiment.

FIG. 3 is a perspective view of a larger portion of the nonvolatile memory device according to the first exemplary embodiment. FIG. 4 is a plan view of the nonvolatile memory device according to the first exemplary embodiment, and FIG. 5 illustrates a circuit diagram of the nonvolatile memory device according to the first exemplary embodiment. Referring to FIGS. 3-5, the first external electrodes 410_1 may be electrically connected to a first external electrode connector 410, and the second external electrodes 420_2 may be electrically connected to a second external electrode connector 420. Provision of the first external electrode connector 410 and the second external electrode connector 420 may reduce the complexity of peripheral circuitry of the nonvolatile memory device.

As shown in FIG. 3, the internal electrodes 500 may be formed in the spaces between each pair of a first external electrode 410_1 and a second external electrode 420_2. The internal electrodes 500 may extend in a second direction, which is different from the first direction. The internal electrodes 500 may be formed, for example, in a cylindrical shape or a prism shape (i.e., they have a cylindrical-shaped or prism-shaped cross-section). The second direction may be substantially perpendicular to the first direction, and may be substantially perpendicular to the top surface of the substrate 100.

The internal electrodes 500 may be formed, for example, tungsten, titanium nitride, aluminum, copper, iridium, platinum, ruthenium, silver (Ag), polysilicon, and/or other noble metals. In certain embodiments, the internal electrodes 500 may comprise one or more of copper, iridium, platinum, ruthenium, silver, polysilicon and/or other noble metals.

The variable resistors 600 may be interposed between the first external electrodes 410_1 and the internal electrodes 500 and between the second external electrodes 420_2 and the internal electrodes 500, and may directly contact the first external electrodes 410_1, the internal electrodes 500 and the second external electrodes 420_2. In some embodiments, the variable resistors 600 may cover the external circumferential surfaces of the internal electrodes 500. For example, the variable resistors 600 may be formed as hollow cylinders or hollow prisms that cover the entire external circumferential surfaces of the internal electrodes 500.

When an electric signal is applied to the internal electrodes 500, the first external electrodes 410_1 and the second external electrodes 420_2, resistance of portions of the variable resistors 600 formed between the first external electrodes 410_1 and the internal electrodes 500 or resistance of portions of the variable resistors 600 formed between the second external electrodes 420_1 and the internal electrodes 500 may vary accordingly. Referring to FIG. 4, each of the variable resistors 600 may be divided into a first portion 610 that directly contacts a corresponding first external electrode 410_1 and a second portion 620 that directly contacts a corresponding second external electrode 420_2. The first and second portions 610 and 620 of each of the variable resistors 600 may serve as different resistance materials.

The variable resistors 600 may be formed of, for example, chalcogenide, a transition metal oxide, a perovskite oxide or a solid electrolyte material containing metal ions.

Referring to FIGS. 3 and 4, each of the active regions 110 may include a first region 110_1 extending substantially in the same direction as the plurality of bitlines 300 (i.e., in the third direction) and a second region 110_2 protruding from the first region 110_1 and extending substantially in the same direction as the wordlines (210, 220 and 230) (i.e., in the first direction). If the first direction is substantially perpendicular to the third direction, each of the active regions 110 may be T-shaped.

In the first exemplary embodiment, two internal electrodes 500 are connected to each of the active regions 110, two wordlines (210, 220 and 230) may cross over each of the active regions 110, and one bitline 300 may be connected to each of the active regions 110 via its bitline contact 350. More specifically, two internal electrodes 500 and two variable resistors 600 may be connected to each of the first regions 110_1 of an active region 110, and one bitline contact 350 may be connected to each of the second regions 110_2 of the active region 110. Since the pair of wordlines (210, 220 and 230) that cross over each of the active regions 110 share one bitline 300, it is possible to increase the density of the memory cells.

A first external electrode 410_1, an internal electrode 500 and a variable resistor 600 that is interposed between the first external electrode 410_1 and the internal electrode 500, and a second external electrode 420_2, an internal electrode 500 and a variable resistor 600 that is interposed between the second external electrode 420_2 and the internal electrode 500 may form respective resistive memory cells. A plurality of such resistive memory cells may be arranged on the substrate 100. In this case, even if a nonvolatile memory device is designed to have an $8F^2$ layout, the area of resistive memory cells may be reduced from $8F^2$ to $4F^2$ because two resistive memory cells are formed in each unit memory cell area.

Source/drain regions and a gate electrode 220 in each of the active regions 110 may serve as selectors for choosing an internal electrode 500 and a memory cell. In the first exemplary embodiment, metal-oxide semiconductor field effect transistors (MOSFETs) may be used as the selectors. However, the present invention is not restricted to this. For example, in other embodiments, bipolar transistors or diodes may be used as the selectors.

Referring to FIG. 5, two variable resistors $Rv_1$ and $Rv_2$ may be connected to a selector Tr. The selector Tr may choose one of the two variable resistors $Rv_1$ and $Rv_2$. If a transistor is used as the selector Tr, a positive voltage, a negative voltage or both may be applied as a program voltage. Thus, the first exemplary embodiment can be applied to a bipolar RRAM device which show switching properties only when a bidirectional voltage is applied.

A second interlayer dielectric layer (not shown) and upper wiring layers may be formed above the internal electrodes 500.

The nonvolatile memory device according to the first exemplary embodiment may also include peripheral circuitry for turning on or off a transistor by applying a signal to each of the wordlines (210, 220 and 230) and a plurality of sense amplifiers (not shown) connected to the bitlines 300.

According to the first exemplary embodiment, it is possible to reduce the area of resistive memory cells and to increase the density of memory cells by forming a plurality of resistive memory cells for each internal electrode.

A nonvolatile memory device according to another exemplary embodiment of the present invention will hereinafter be described in detail with reference to FIGS. 6 and 7.

Figure 6:
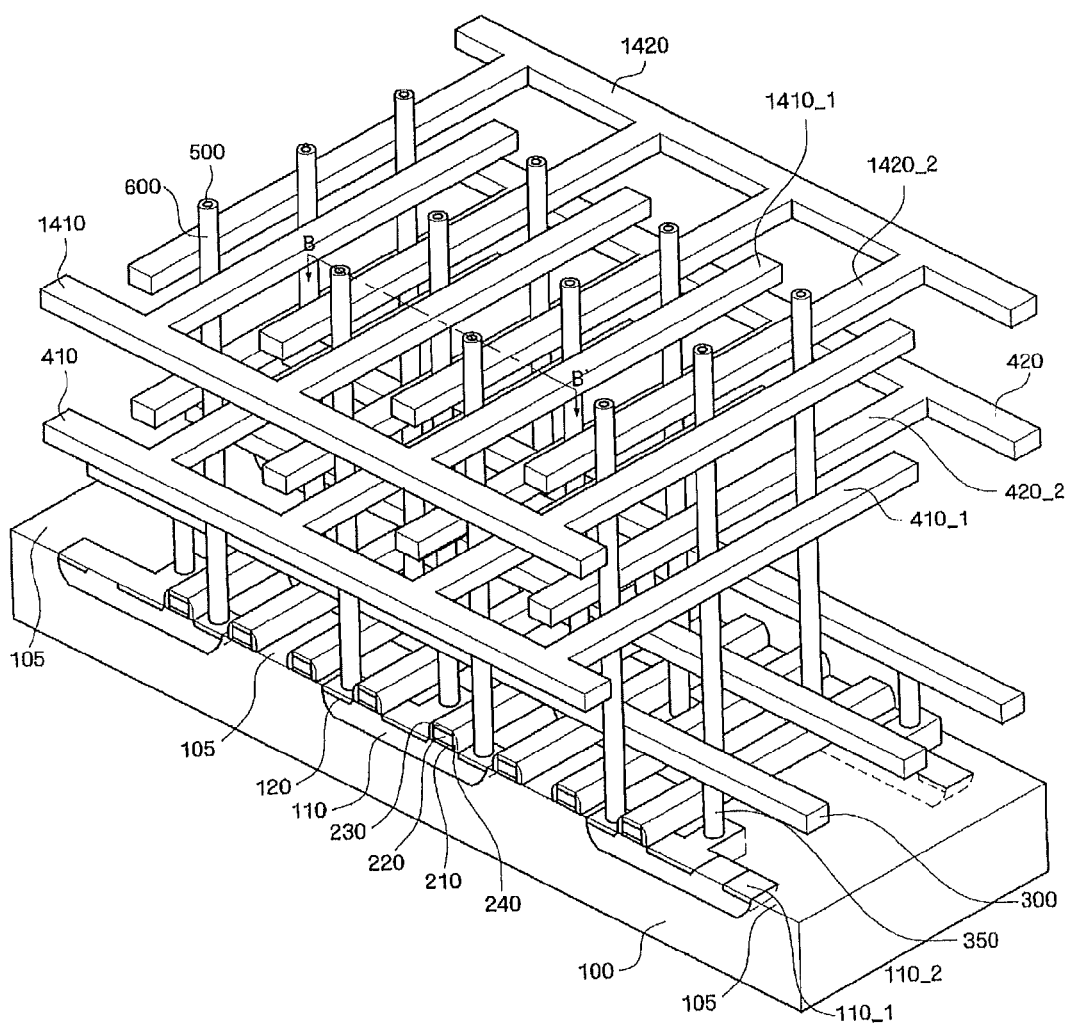
FIG. 6 is a perspective view of a nonvolatile memory device according to a second exemplary embodiment of the present invention.

FIG. 6 is a perspective view of a nonvolatile memory device according to a second exemplary embodiment of the present invention. FIG. 7 is a cross-sectional view, taken along line B-B' of FIG. 6, of the nonvolatile memory device according to the second exemplary embodiment. In FIGS. 1-7, like reference numerals indicate like elements, and thus, detailed descriptions thereof will be omitted.

Figure 7:
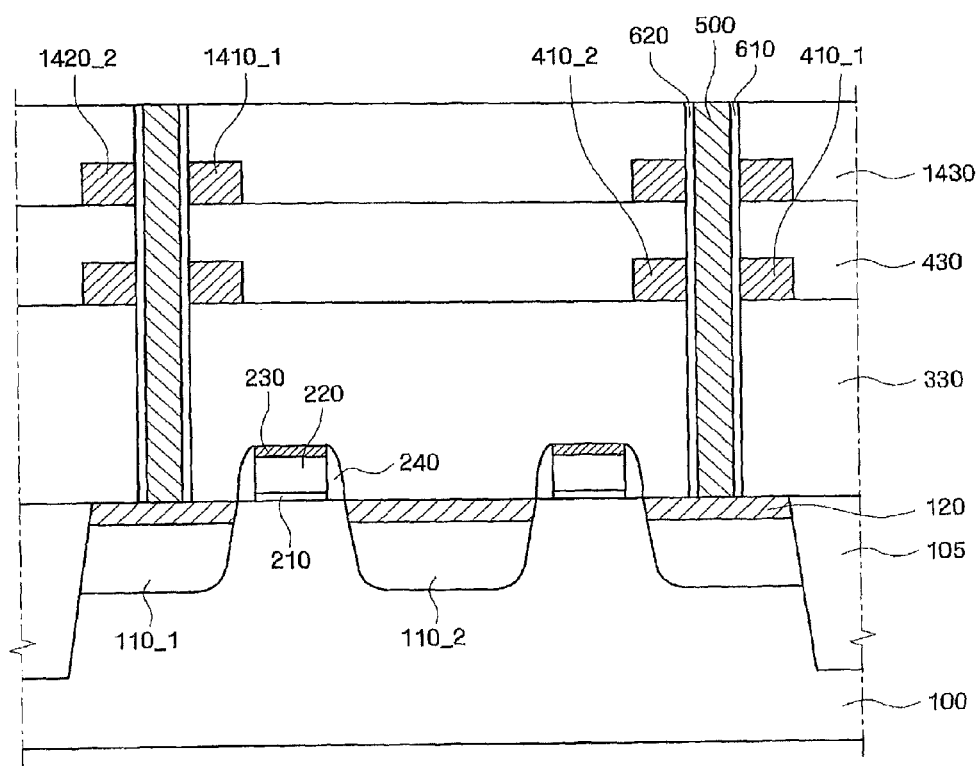
FIG. 7 is a cross-sectional view, taken along line B-B' of FIG. 6, of the nonvolatile memory device according to the second exemplary embodiment.

Referring to FIGS. 6 and 7, the nonvolatile memory device may include a plurality of first external electrodes 410_1, a plurality of additional external electrodes 1410_1 that are formed above the first external electrodes 410_1, a plurality of second external electrodes 420_2 and a plurality of additional second external electrodes 1420_2 that are formed above the second external electrodes 420_2. The first external electrodes 410_1, the additional first external electrodes 1410_1, the second external electrodes 420_2 and the additional second external electrodes 1420_2 may form a plurality of layers of external electrodes. Thus, the density of resistive memory cells may increase compared to the first exemplary embodiment. More specifically, if a nonvolatile memory device is designed to have an $8F^2$ layout and includes n external electrode layers, each resistive memory cell may have an area of $8/(2n)F^2$.

The additional first external electrodes 1410_1 may overlie the first external electrodes 410_1, respectively, and the additional first external electrodes 1420_2 may overlie the second external electrodes 420_2, respectively. The additional first external electrodes 1410_1 and the additional second external electrodes 1420_2 may be formed of the same material that is used to form the first external electrodes 410_1 and the second external electrodes 420_2.

In the second exemplary embodiment, twice as many resistive memory cells as there are external electrode layers may be provided for each of a plurality of internal electrodes 500, and thus, the density of resistive memory cells may increase. That is, if the first external electrodes 410_1, the additional first external electrodes 1410_1, the second external electrodes 420_2 and the additional second external electrodes 1420_2 form n external electrode layers, 2n resistive memory cells may be provided for each of the internal electrodes 500, and thus, the density of resistive memory cells may increase.

The nonvolatile memory device according to the second exemplary embodiment may also include a plurality of first external electrodes 410_1, which are located on only a first side of the internal electrodes 500, and a plurality of additional first external electrodes 1410_1, which are also located on only the first side of the internal electrodes 500 and overlap the first external electrodes 410_1 along the direction in which the internal electrodes 500 extend. The second external electrodes 420_2 and additional second external electrodes 1410_2 may only be formed on a second side of the internal electrodes. That is, the first and second external electrodes and additional first and second external electrodes 410_1, 420_2, 1410_1 and 1420_2 is arranged in parallel on one side of the substrate 100, and may be the first and second external electrodes of a single layer, which share an internal electrode 500, or is arranged to be overlapped to each other in a direction that is perpendicular to one side of the substrate 100, i.e., in an extended direction of the internal electrode 500, and may be the first external electrode 410_1 and the additional first external electrode 1410_1, which intersect with one side of the internal electrode 500, or may be a combination of those electrodes. That is, the first and second electrodes and additional first and second external electrodes may be formed as a plurality of layers at both sides of the internal electrode 500 centering on the internal electrode 500. In the present specification, the vertically-arranged first external electrode 410_1 and the additional first external electrode 1410_1, which are arranged in a vertical direction, are called a third external electrode and a fourth external electrode, respectively. The vertically-arranged second external electrode 410_2 and the additional second external electrode 1410_2 are also called the third external electrode and the fourth external electrode.

A nonvolatile memory device according to another exemplary embodiment of the present invention will hereinafter be described in detail with reference to FIGS. 8 and 9.

Figure 8:
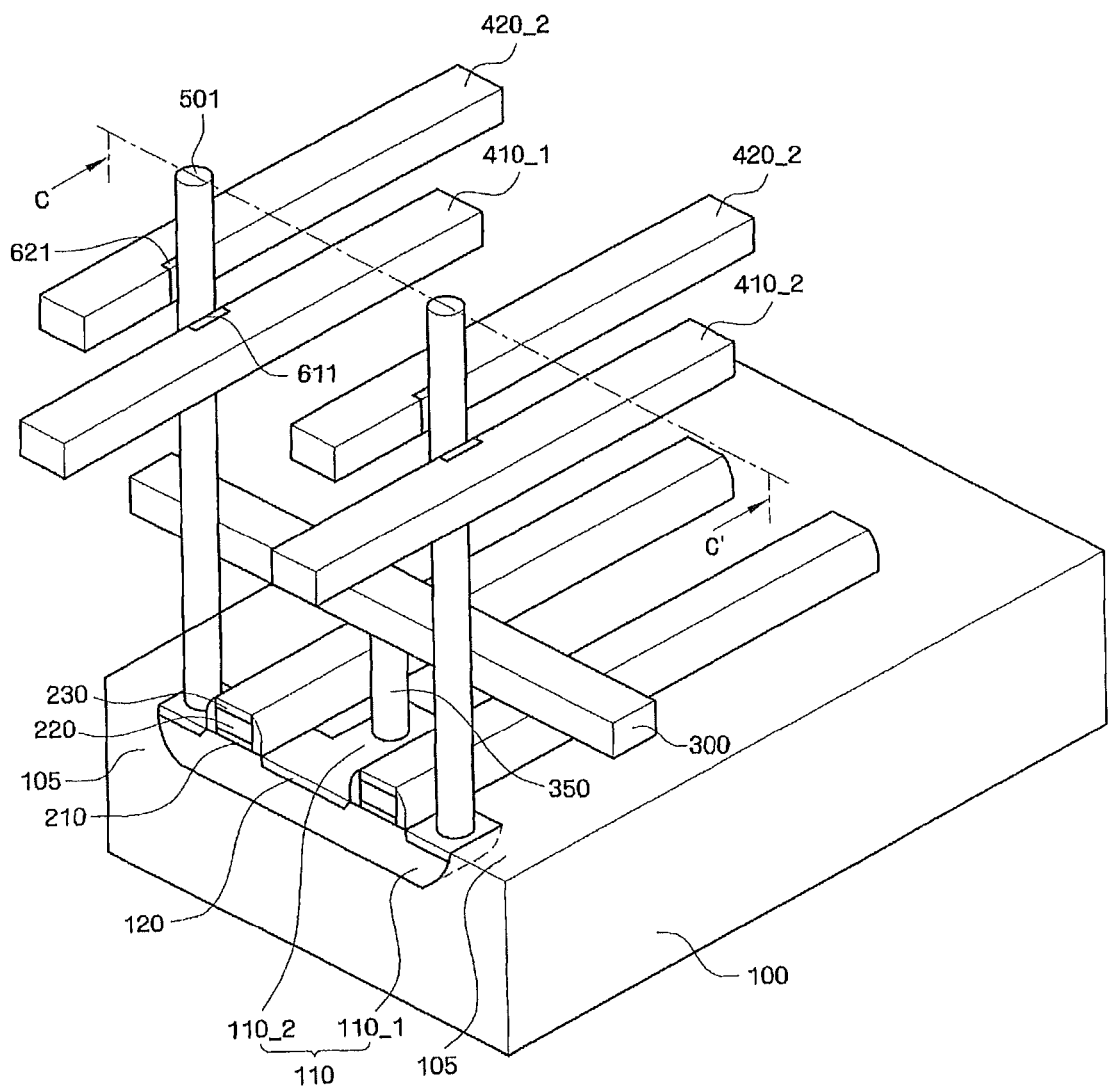
FIG. 8 is a schematic perspective view of part of a nonvolatile memory device according to a third exemplary embodiment of the present invention.

FIG. 8 is a schematic perspective view of part of a nonvolatile memory device according to a third exemplary embodiment of the present invention. FIG. 9 is a cross-sectional view, taken along line C-C' of FIG. 8, of the nonvolatile memory device according to the third exemplary embodiment.

Figure 9:
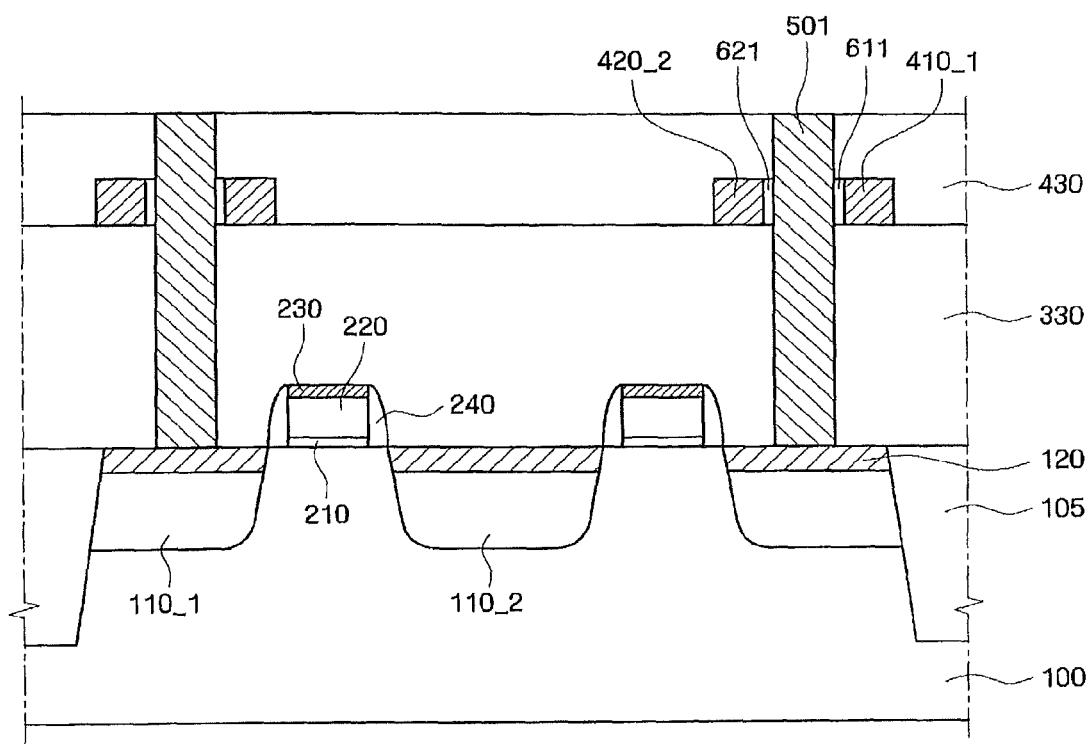
FIG. 9 is a cross-sectional view, taken along line C-C' of FIG. 8, of the nonvolatile memory device according to the third exemplary embodiment.

Referring to FIGS. 8 and 9, a variable resistor may be formed that includes a first portion 611 and a second portion 621. The first portion 611 may be formed in the overlapping area of an internal electrode 501 and a first external electrode 410_1, and the second portion 621 may be formed in the overlapping area of the internal electrode 501 and a second external electrode 420_2. The first portion 611 of the variable resistor may be formed by thermally oxidizing or plasma-oxidizing a portion of the first external electrode 410_1 that overlaps the internal electrode 501, and the second portion 621 of the variable resistor may be formed by thermally oxidizing or plasma-oxidizing a portion of the second external electrode 420_2 that overlaps the internal electrode 501.

In the third exemplary embodiment, the variable resistor (611 and 621) may be formed only in the overlapping area of the internal electrode 501 and the first external electrode 410_1 and the overlapping area of the internal electrode 501 and the second external electrode 420_2. Thus, it is possible to reduce the manufacturing cost of the variable resistor (611 and 621). It will be appreciated, however, that the first and second portions 611, 621 of the variable resistor may also extend beyond the overlapping areas in some embodiments.

In the third exemplary embodiment, the internal electrode 501 may completely fill the gap between the first external electrode 410_1 and the second external electrode 420_2. Thus, the diameter of the internal electrode 501 may be greater than in the first and second exemplary embodiments.

Figure 10:
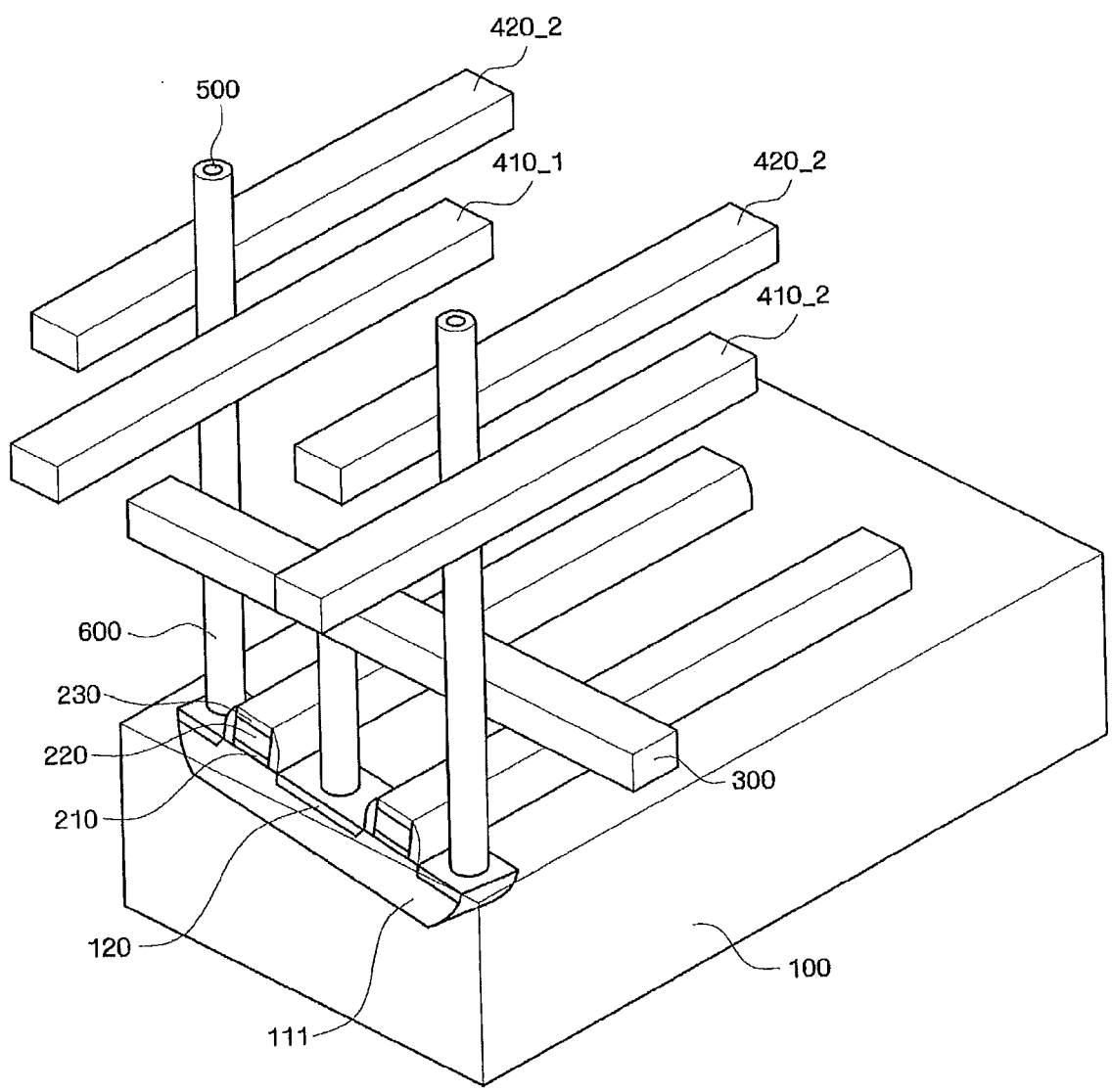
FIG. 10 is a schematic perspective view of part of a nonvolatile memory device according to a fourth exemplary embodiment of the present invention.
Figure 11:
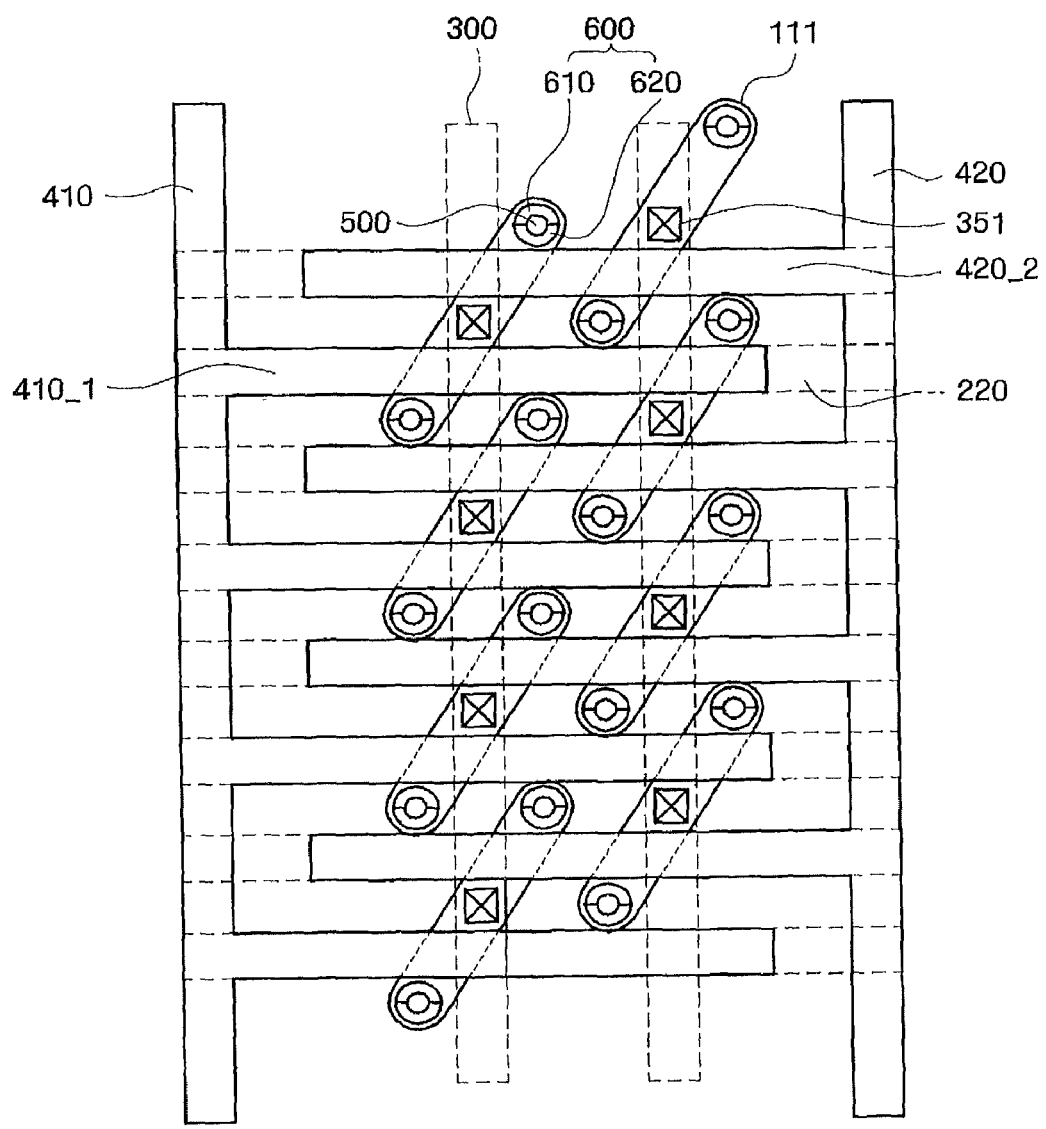
FIG. 11 is a plan view of the nonvolatile memory device according to the fourth exemplary embodiment.

A nonvolatile memory device according to another exemplary embodiment of the present invention will hereinafter be described in detail with reference to FIGS. 10 and 11. FIG. 10 is a schematic perspective view of part of a nonvolatile memory device according to a fourth exemplary embodiment of the present invention. FIG. 11 is a plan view of a larger portion of the nonvolatile memory device according to the fourth exemplary embodiment of the present invention.

The fourth exemplary embodiment is different from the first through third exemplary embodiments in terms of the shape and the arrangement of active regions 111. In particular, in the fourth exemplary embodiment, the active regions 111 may extend in a fourth direction, which is different from both the first direction in which the plurality of wordlines (210, 220 and 230) extend and the third direction in which the plurality of bitlines 300 extend.

The fourth direction may form an acute angle with the first and third directions. The fourth direction may divide the angle between the first and third directions. More specifically, two intersecting directions form two angles. The expression "the angle between two directions," as used herein, refers to the smallest angle formed by two intersecting directions. For example, if two intersecting directions form two angles of 120° and two angles of 60°, the angle between the two intersecting directions is 60°. The fourth direction may form an angle of, for example, 45°, with the first direction and the third direction. In this case, the two internal electrodes 500 that are connected to each of the active regions 111 may be disposed on opposite sides of the bitline that is connected to each corresponding active region 111, as is shown in FIG. 11.

The nonvolatile memory device according to the fourth exemplary embodiment may have a $6F^2$ layout. In the fourth exemplary embodiment, two resistive memory cells may be formed in each unit memory cell area, and thus, each resistive memory cell may have an area of $3F^2$. In the fourth exemplary embodiment, like in the second exemplary embodiment, if a plurality of first external electrodes 410_1 and a plurality of second external electrodes 420_2 are arranged form n external electrode layers, each resistive memory cell may have an area of $6/(2n)F^2$.

A method of fabricating a nonvolatile memory device according to an exemplary embodiment of the present invention will hereinafter be described in detail with reference to FIGS. 7 and 12-17.

FIGS. 12-17 are cross-sectional views illustrating a method of fabricating a nonvolatile memory device according to exemplary embodiments of the present invention.

Figure 12:
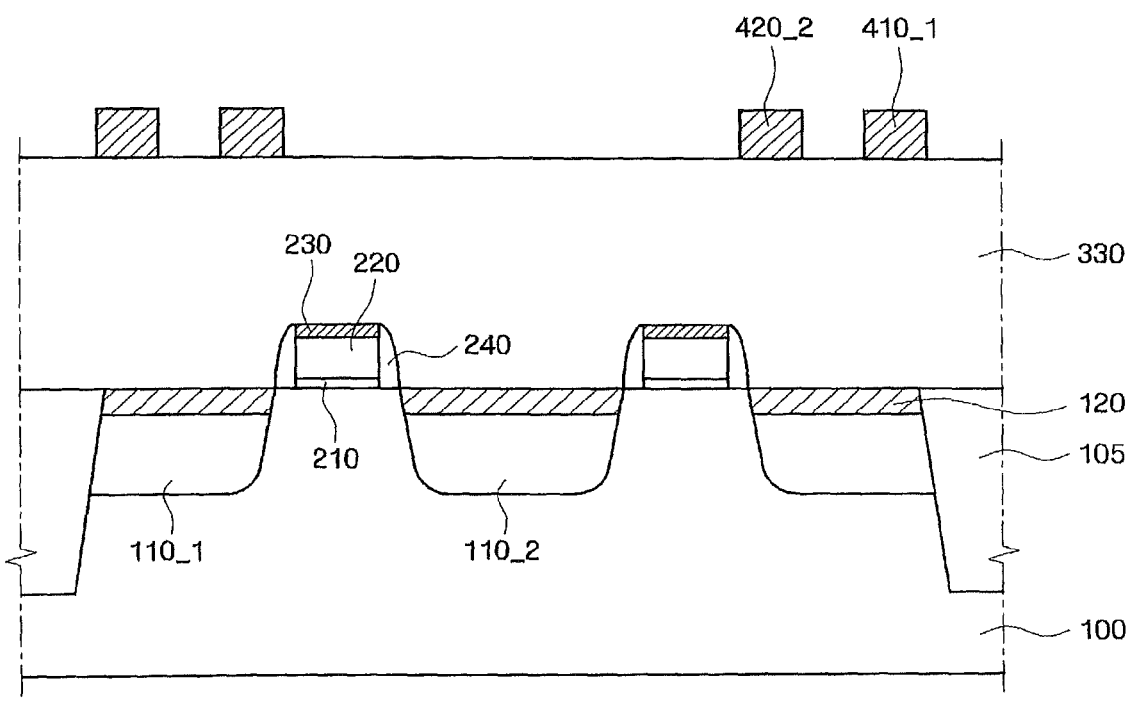
FIGS. 12 through 17 are cross-sectionals views that illustrate a method of fabricating a nonvolatile memory device according to exemplary embodiments of the present invention.

Referring to FIG. 12, a plurality of isolation regions 105 may be formed in a substrate 100 by using, for example, LOCOS. Thereafter, a plurality of gate insulating layer patterns 210 and a plurality of gate electrodes 220 may be formed by, for example, forming a gate insulating layer (not shown) of silicon oxide using chemical vapor deposition (CVD), plasma-enhanced CVD (PE-CVD) or high-density plasma CVD (HDP CVD), forming a conductive material layer for forming the gate electrodes 220 on the gate insulating layer and patterning the gate insulating layer and the conductive material layer. Thereafter, spacers 240 may be formed on both sides of each of the gate insulating layer patterns 210 and the gate electrodes 220. Thereafter, source/drain regions may be formed by implanting n- or p-type impurities into the substrate 100. In some embodiments, the source/drain regions may be formed by performing impurity implantation twice or more while varying the concentration of impurities. Thermal treatment may be performed on the source/drain regions by using rapid thermal process (RTP) equipment or a furnace. Thereafter, a plurality of silicide layer patterns 120 and a plurality of gate silicide layer patterns 230 may be formed on the substrate 100. Thereafter, a plurality of bitlines (not shown) and a first interlayer dielectric layer 330 may be deposited.

Thereafter, a first external electrode material and a second external electrode material may be deposited on the first interlayer dielectric layer 330 through CVD, physical vapor deposition (PVD) or atomic layer deposition (ALD) and may then be patterned, thereby forming a plurality of first external electrodes 410_1 and a plurality of second external electrodes 420_2. The first external electrodes 410_1 and the second external electrodes 420_2 may be spaced apart from each other.

Figure 13:
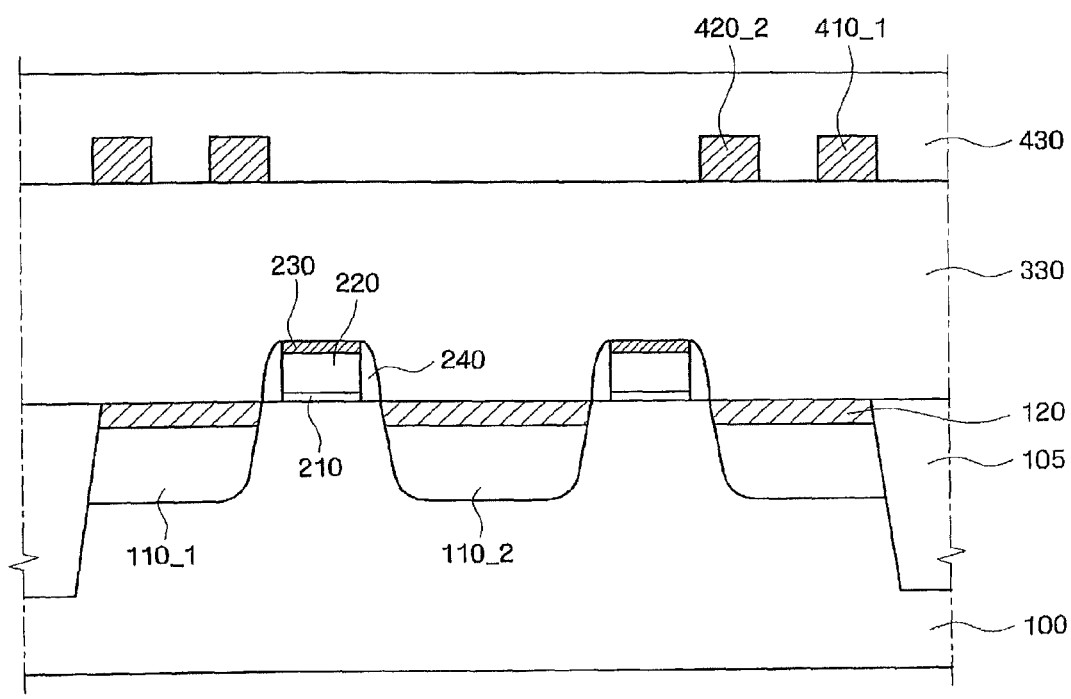

Thereafter, referring to FIG. 13, a second interlayer insulting layer 430 may be formed on the first interlayer dielectric layer 330 so as to cover and insulate the first external electrodes 410_1 and the second external electrodes 420_2.

Figure 14:
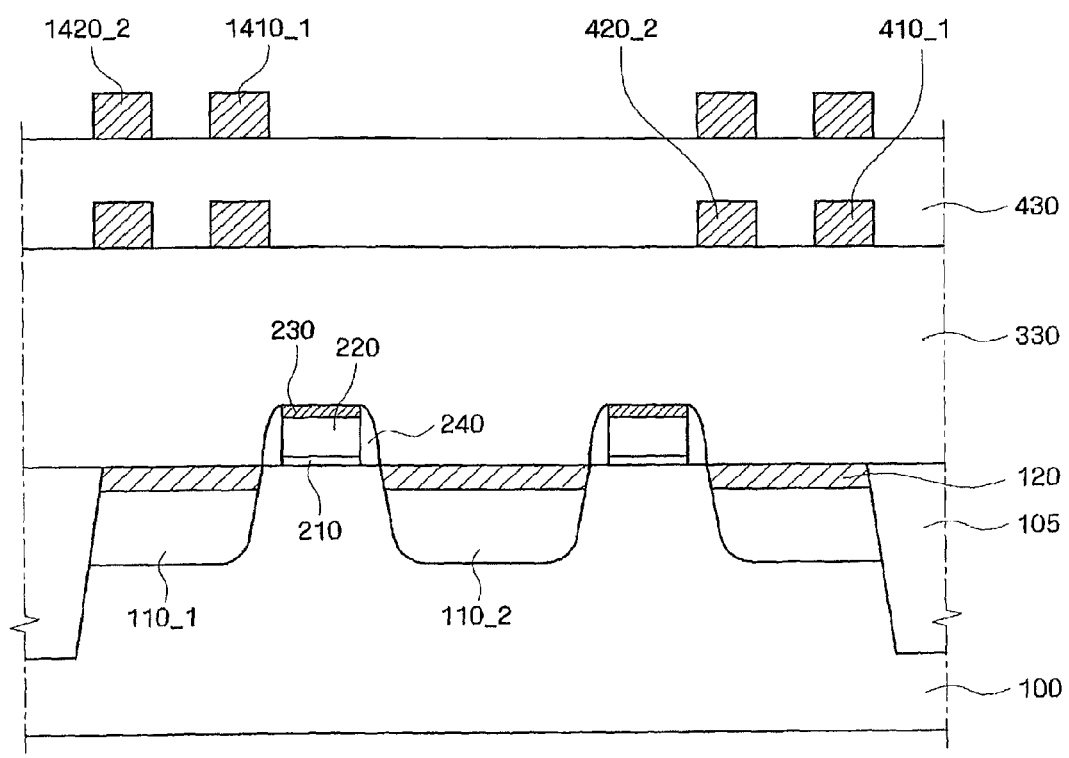

Thereafter, referring to FIG. 14, a plurality of additional first external electrodes 1410_1 and a plurality of additional second external electrodes 1420_2 may be formed on the second interlayer dielectric layer 430 by using, for example, the same method used to form the first external electrodes 410_1 and the second external electrodes 420_2. The additional first external electrodes 1410_1 may respectively overlie the first external electrodes 410_1, and the additional second external electrodes 1420_2 may respectively overlie the second external electrodes 420_2. The formation of the additional first external electrodes 1410_1 and the additional second external electrodes 1420_2 is optional. In addition, a plurality of third external electrodes 410_1 and a plurality of fourth external electrodes 1410_1 may be formed in a plurality of layers.

Figure 15:
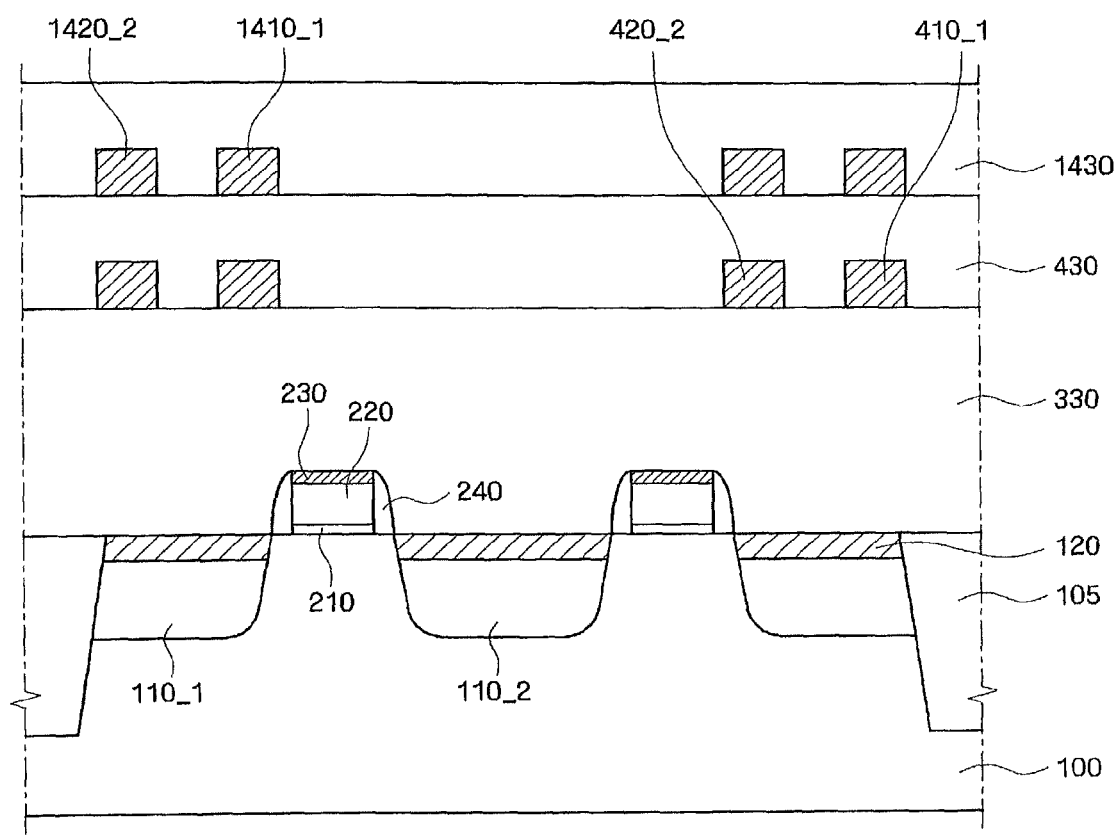

Thereafter, referring to FIG. 15, a third interlayer dielectric layer 1430 may be formed so as to insulate the additional first external electrodes 1410_1 and the additional second external electrodes 1420_2. The operations shown in FIGS. 14 and 15 may be performed repeatedly, thereby forming n external electrode layers.

Figure 16:
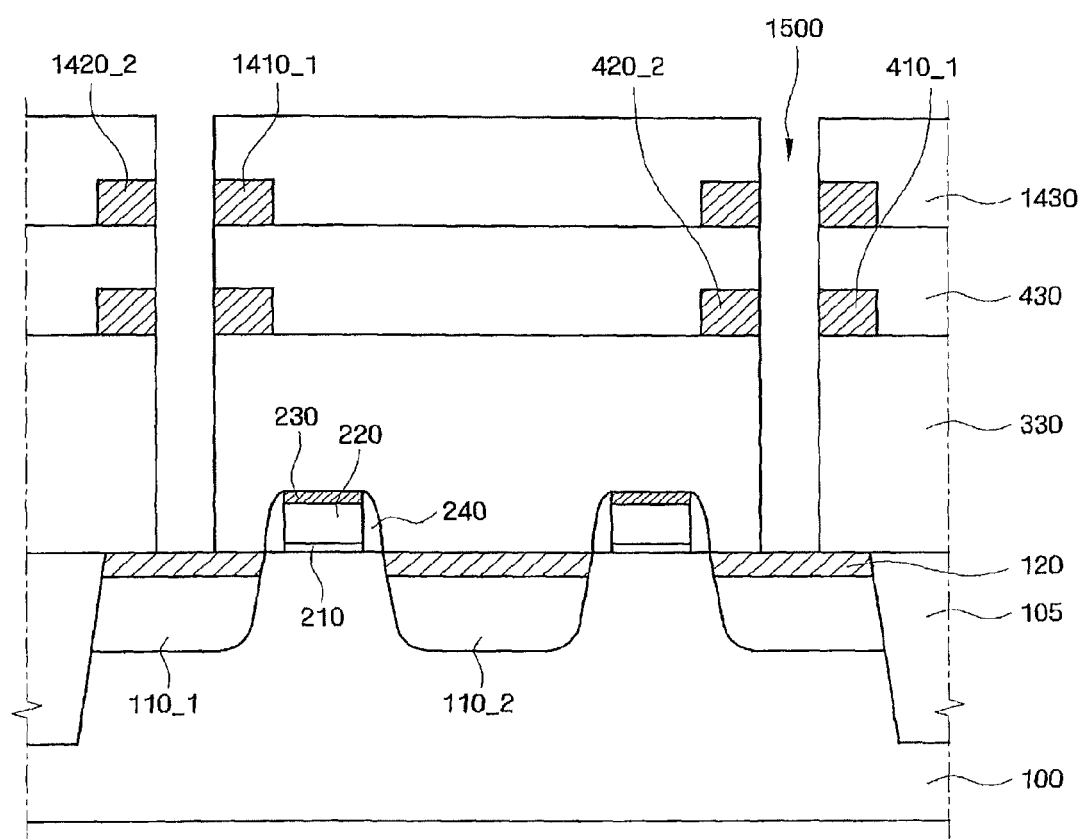

Referring to FIG. 16, a plurality of contact holes 1500 may be formed in, for example, a cylindrical shape or a prism shape by etching the first interlayer dielectric layer 330, the second interlayer dielectric layer 430 and the third interlayer dielectric layer 1430 using an etchant. The contact holes 1500 may be connected to a first region 110_1 of an active region 110. The contact holes 1500 may be formed in a second direction, which is different from the direction in which the wordlines (210, 220 and 230) extend, i.e., the first direction. The second direction may be perpendicular to the top surface of the substrate 100. An etching stopper layer (not shown) may be formed below the first interlayer dielectric layer 330 in order to prevent the silicide layer patterns 120 from being etched away.

Figure 17:
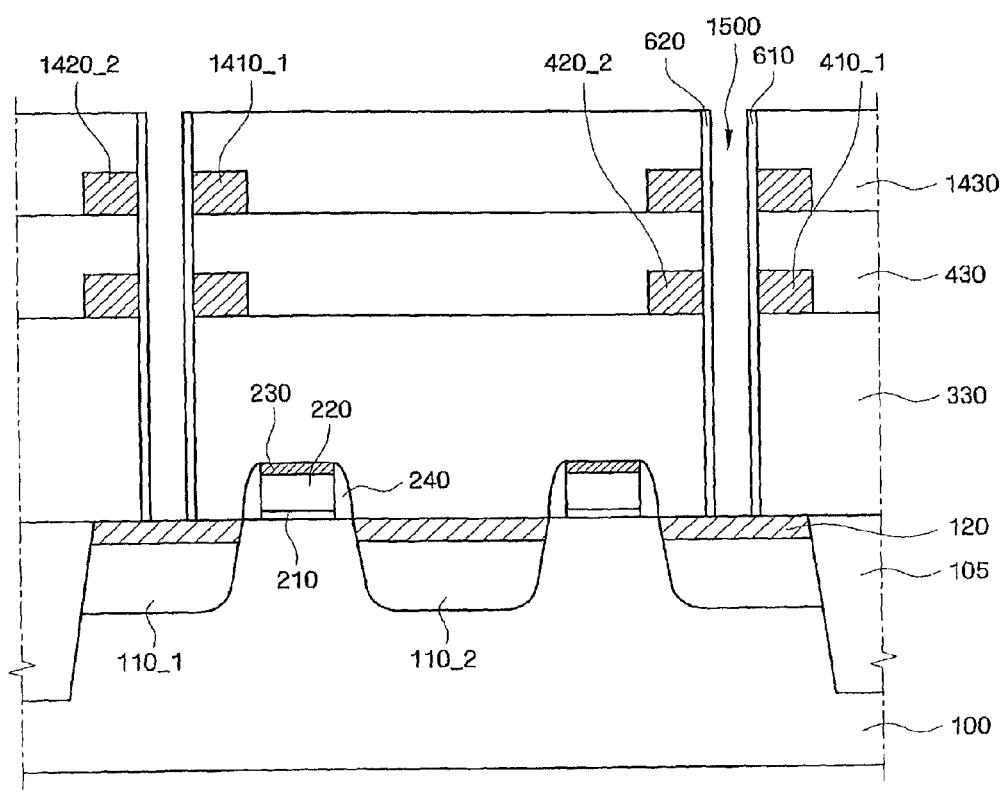

Referring to FIG. 17, a plurality of variable resistors (610 and 620) may be formed in a cylindrical shape or a prism shape by depositing one variable-resistance material selected from chalcogenide, a transition metal oxide, a perovskite oxide and a solid electrolyte material containing metal ions on the third interlayer dielectric layer 1430 and in the contact holes 1500 through CVD, PVD or ALD and patterning the deposited variable-resistance material so as to leave the deposited variable-resistance material only on the sidewalls of each of the contact holes 1500. The variable resistors (610 and 620) may contact the first external electrodes 410_1 and the second external electrodes 420_2.

Thereafter, referring to FIG. 7, a plurality of internal electrodes 500 may be formed by filling the contact holes 1500 with a conductive material. The internal electrodes 500 may extend in the second direction, and may contact the variable resistors (610 and 620). More specifically, the internal electrodes 500 may be formed by filling the contact holes 1500 with a conductive material through CVD, ALD, PVD or electroplating and performing planarization such as chemical mechanical polishing (CMP). Thereafter, upper wiring layers, driving circuits and sense amplifiers may be formed, thereby completing the formation of a nonvolatile memory device.

A method of fabricating a nonvolatile memory device according to another exemplary embodiment of the present invention will hereinafter be described in detail with reference to FIGS. 9, 12-16 and 18.

Figure 18:
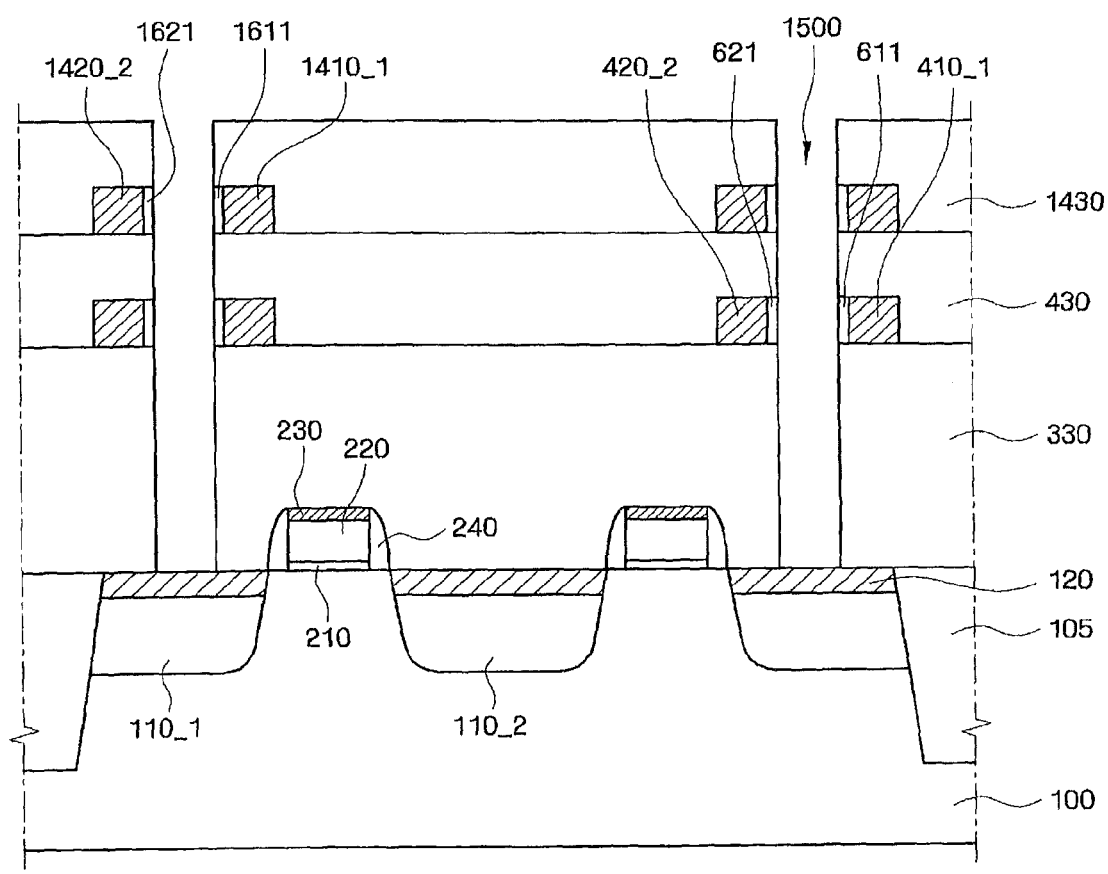
FIG. 18 is a cross-sectional view illustrating a method of fabricating a nonvolatile memory device according to further embodiments of the present invention.

FIG. 18 is a cross-sectional view illustrating a method of fabricating a nonvolatile memory device according to another exemplary embodiment of the present invention. The exemplary embodiment of FIG. 18 will hereinafter be described in detail, mainly focusing on differences with the exemplary embodiment of FIGS. 12-17.

The structure shown in FIG. 16 may be obtained by performing the same operations described above with reference to FIGS. 12-16.

Thereafter, portions of a plurality of first external electrodes 410_1 exposed by a plurality of contact holes 1500 and portions of a plurality of second external electrodes 420_2 exposed by the contact holes 1500 may be thermally oxidized or plasma-oxidized, thereby forming a plurality of first variable resistor portions 611 and a plurality of second variable resistor portions 621. If a plurality of additional first external electrodes 1410_1 and a plurality of additional second external electrodes 1420_2 are formed over the first external electrodes 410_1 and the second external electrodes 420_2 to form a plurality of external electrode layers, portions of the additional first external electrodes 1410_1 exposed by the contact holes 1500 and portions of the additional second external electrodes 1420_2 exposed by the contact holes 1500 may also be oxidized, thereby forming a plurality of additional first variable resistor portions 1611 and a plurality of additional second variable resistor portions 1621.

Thereafter, referring to FIG. 9, a plurality of internal electrodes 501 may be formed by filling a plurality of contact holes 1500 with a conductive material and performing planarization. The internal electrodes 501 may be formed using the same method used to form the internal electrodes 500 in the exemplary embodiment of FIGS. 12-17. Even though the nonvolatile memory device shown in FIG. 9 includes only a single external electrode layer, it will be understood that the present invention can also be applied to a nonvolatile memory device that includes a plurality of external electrode layers, as shown in FIG. 18.

Thus, pursuant to embodiments of the present invention, nonvolatile memory devices are provided that include internal electrodes that extend substantially perpendicularly from a face of a substrate and first and second external electrodes that extend substantially parallel to the face of the substrate. Variable resistors are provided between each internal electrode and corresponding of the first and second external electrodes. The nonvolatile memory devices according to embodiments of the present invention may have a three-dimensional stacked structure in which multiple layers of external electrodes are provided with respect to each internal electrode in order to further increase the density of the memory cells.

A processing system according to an exemplary embodiment of the present invention will hereinafter be described in detail with reference to FIG. 19.

Figure 19:
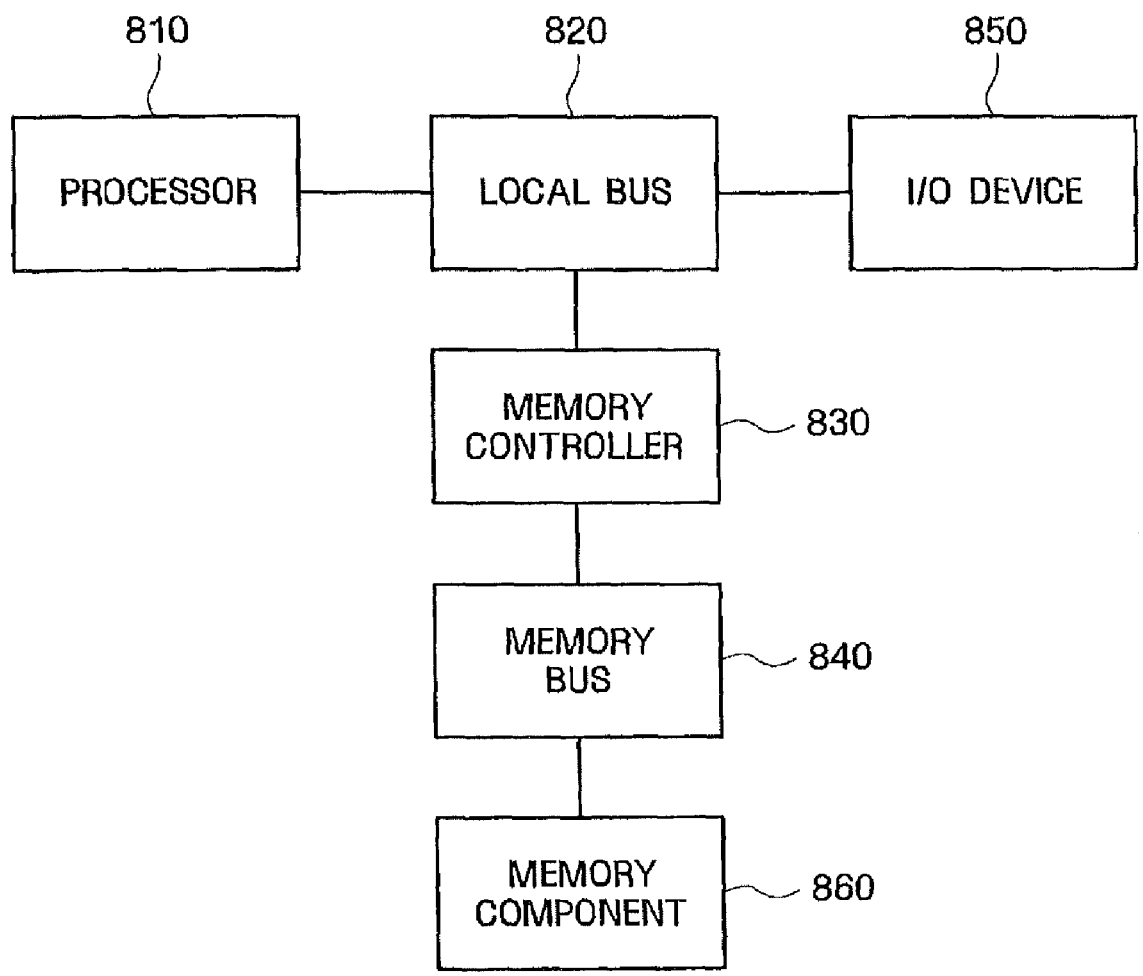
FIG. 19 is a block diagram of a processing system including a nonvolatile memory device, according to an exemplary embodiment of the present invention.

FIG. 19 is a block diagram of a processing system including a nonvolatile memory device, according to an exemplary embodiment of the present invention. Referring to FIG. 19, the processing system may be, for example, a mobile phone, an MP3 player, a navigation system or a household appliance.

The processing system may include at least one processor 810, a semiconductor memory device 860 and an input/output (I/O) device 850.

The semiconductor memory device 860 may be any one of the nonvolatile memory devices according to the first through fourth exemplary embodiments. The semiconductor memory device 860 may store various codes and data for executing the processor 810.

The I/O device 850 may communicate data with the semiconductor memory device 860 through a local bus 820. The semiconductor memory device 860 may be connected to a memory bus 840. The memory bus 840 may be connected to the local bus 820 through a memory controller 830.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a nonvolatile memory device, the method comprising:

forming a plurality of first external electrodes and a plurality of second external electrodes on a substrate, the first external electrodes and the second external electrodes extending substantially in parallel with a face of the substrate and being isolated from each other;

forming an insulating layer that covers the first external electrodes and the second external electrodes;

forming a plurality of contact holes through the insulating layer between the first external electrodes and the second external electrodes, the contact holes being substantially perpendicular to the face of the substrate;

forming a plurality of variable resistors that directly contact the first external electrodes and the second external electrodes; and forming a plurality of internal electrodes by depositing a conductive material in the contact holes, the internal electrodes contacting the variable resistors and extending in a direction substantially perpendicular to the face of the substrate.

2. The method of claim 1, wherein forming the plurality of variable resistors comprises oxidizing portions of the first external electrodes exposed by the contact holes and portions of the second external electrodes exposed by the contact holes.

3. The method of claim 1, wherein forming the plurality of the variable resistors comprises forming a variable-resistance material layer by depositing a variable-resistance material on the insulating layer, and etching the variable-resistance material layer so as to leave the variable-resistance material layer only on sidewalls of each of the contact holes.

4. The method of claim 1, wherein forming the plurality of internal electrodes comprises forming the internal electrodes using chemical vapor deposition (CVD), atomic layer deposition (ALD), physical vapor deposition (PVD) and/or electroplating.

5. The method of claim 1, wherein forming the plurality of first external electrodes and the plurality of second external electrodes and forming the insulating layer are each performed more than one time.

* * * * *